United States Patent
Niemann et al.

(10) Patent No.: US 6,531,181 B1
(45) Date of Patent: Mar. 11, 2003

(54) PROCESS FOR PRODUCING A CONDUCTIVE COATING ON GLASS OR ON ENAMELLED STEEL AND SUBSTRATES COATED BY THIS PROCESS

(75) Inventors: Axel Niemann, Frankfurt (DE); Guy Roche, Isle (FR)

(73) Assignee: DMC² Degussa Metals Catalysts Cerdec AC, Frankfurt am Main (DE)

( * ) Notice: Subject to any disclaimer, the term of this patent is extended or adjusted under 35 U.S.C. 154(b) by 0 days.

(21) Appl. No.: 09/668,133

(22) Filed: Sep. 22, 2000

(30) Foreign Application Priority Data

Sep. 24, 1999 (DE) .......................... 199 45 866

(51) Int. Cl.⁷ .............................. B05D 3/02; B05D 5/06; B05D 5/12
(52) U.S. Cl. ............................... 427/163.1; 427/126.2; 427/165; 427/376.2; 427/376.3
(58) Field of Search .................... 427/126.2, 165, 427/163.1, 376.2, 376.3, 383.5

(56) References Cited

U.S. PATENT DOCUMENTS

| | | | |
|---|---|---|---|
| 3,833,348 A | 9/1974 | Stokes et al. | |
| 4,039,721 A | 8/1977 | Weitze et al. | |
| 4,053,864 A | * 10/1977 | Rodriguez et al. | 338/22 SD |
| 4,255,291 A | * 3/1981 | Needes et al. | 252/578 |
| 4,450,346 A | * 5/1984 | Boaz | 219/522 |
| 5,358,666 A | 10/1994 | Sasaki | |
| 5,562,972 A | * 10/1996 | Sasaki | 428/209 |
| 5,856,015 A | 1/1999 | Buchanan | |

* cited by examiner

Primary Examiner—Michael Barr
(74) Attorney, Agent, or Firm—Daniel P. Cillo; Eckert Seamans Cherin & Mellott, LLC

(57) ABSTRACT

The invention relates to a process for producing a conductive coating on glass and enamelled steel using a screen-printable aluminum paste. The paste to be used contains: 40 to 80 wt. %, in particular, 50 to 75 wt. % aluminum powder; 5 to 40 wt. %, in particular, 9 to 25 wt. % glass frit having an initial softening temperature of 400 to 700° C., in particular, 420 to 580° C.; 10 to 35 wt. % of a liquid or thermoplastic medium; and 0 to 10 wt. % sintering aid. The substrate coated with the paste is heated at 500 to 750° C., in particular, 590 to 690° C. The coating on the substrate is characterized by having a low specific resistance of less than 100 $\mu$ohm·cm, in particular in the range of 10 to 70 $\mu$ohm·cm, and good adhesion.

7 Claims, No Drawings

PROCESS FOR PRODUCING A CONDUCTIVE COATING ON GLASS OR ON ENAMELLED STEEL AND SUBSTRATES COATED BY THIS PROCESS

FIELD OF THE INVENTION

The invention relates to a process for producing conductive coatings, in particular strip conductors, and substrates selected from glass and enamelled steel, coated by this process. A screen-printable aluminum paste based on aluminum powder, at least one glass frit and an organic medium is used. The invention also relates to coated substrates obtainable by this process.

BACKGROUND INFORMATION

Sheets of glass and ceramic substrates for electronic uses are for various purposes often provided partially or over the entire surface with a conductive layer, the coating containing a metal as the component imparting conductivity and a glass composition as binder. Such coatings are often based on precious metals such as, for example, silver in the case of strip conductors on glass or gold and/or platinum metals in the case of strip conductors or electrodes on ceramic substrates, such as semiconductor ceramics.

The production of these strip conductors comprises the application of a metal powder and a liquid or paste-like composition containing glass frit and a subsequent firing at a firing temperature appropriately selected for the substrate.

Whereas the precious metals can be replaced partially by aluminum in the production of conductive coatings on ceramic substrates, it has not hitherto been possible to produce high-quality aluminum-based strip conductors on sheets of glass. Known compositions containing solely aluminum powder as conductive component require a heating temperature which is too high for glass and/or result in a coating having inadequate adhesion and/or inadequate conductivity.

U.S. Pat. No. 3,833,348 describes a process for bonding two parts made of silicon nitride. A composition to be used for this is based on a glass frit and aluminum. The preferred glass frits based on $SiO_2$, $Al_2O_3$ and $MnO$ have a melting point which is too high for application to glass.

U.S. Pat. No. 5,562,972 discloses a conductive paste for the production of moisture-resistant electrodes having a favorable ohmic contact between the electrode and a semiconductor element. The paste contains aluminum powder and a glass frit based on barium borosilicate or/and calcium borosilicate in a quantity of 5 to 40 wt. %, based on aluminum. Again, these pastes cannot be applied to glass, owing to their high melting point.

The composition containing aluminum powder and glass frit according to U.S. Pat. No. 5,856,015 does in fact contain a glass frit having a dilatometric softening point below 600° C., but it is a glaze for a ceramic substrate. The aluminum content of this glaze—30 wt. % at most—is too low for use as conductive paste if an adequate conductivity is to be ensured.

According to U.S. Pat. No. 4,039,721, thick-layer strip conductors on a ceramic substrate are obtained by applying a paste consisting of 3 to 28 wt. % silver powder, 30 to 61 wt. % aluminum powder, 24 to 44 wt. % borosilicate glass frit to the substrate by means of screen printing and heating for a period of 0.2 to 1 hour at 850 to 105° C. Although a "glassy substrate" is referred to in the claims, only ceramic substrates are used in the Examples. The firing temperature does not favor the use of the paste on sheets of glass. It is necessary to use silver in addition to aluminum in order to achieve an adequate conductivity.

U.S. Pat. No. 5,358,666 discloses an ohmic electrode material consisting of 10 to 50 wt. % glass frit selected from zinc borosilicate and lead-zinc borosilicate and of a conductive component containing 48 to 96 wt. % aluminum and 4 to 52 wt. % silicon. These components, in the form of a paste in an organic medium, are applied to a ceramic substrate and heated at 600 to 800° C. In order to ensure that the specific resistance is sufficiently stable even after storage in a moist atmosphere, it is imperative that the paste contain silicon. This document is not concerned with strip conductors on glass.

SUMMARY OF THE INVENTION

An object of the present invention is to provide a process whereby, with the use of a paste containing glass frit and metal powder, conductive coatings can be produced on substrates such as glass and enamelled steel, for example, strip conductors on glass for automobiles and the like. The paste to be used should preferably be silver-free and, after application to glass, capable of being heated under conventional firing conditions, in particular in the rapid firing conventional for sheets of glass for automobiles, and give rise to firmly adhering conductive layers.

A further object is the provision of a glass substrate, in particular a sheet of glass, supplied with a conductive coating and obtainable according to the invention, the coating being characterized by a specific resistance of less than 100 $\mu$ohm·cm and preferably less than 50 $\mu$ohm·cm, at the same time with good adhesion.

DETAILED DESCRIPTION

The present invention provides a process for producing a conductive coating, in particular strip conductors, on a substrate selected from glass and enamelled steel, comprising applying to the substrate a layer comprising a metal powder, at least one glass frit and a paste containing a liquid or thermoplastic medium and heating of the coating at a temperature in the range of 500 to 750° C., which is characterized in that a screen-printable aluminum paste is used which contains (i) aluminum powder having a $d_{50}$ value in the range of 1 to 10 $\mu$m in a quantity of 40 to 80 wt. %, (ii) one or more glass frits having an initial softening temperature in the range of 400 to 700° C. and a $d_{50}$ value in the range of 1 to 10 $\mu$m in a quantity of 5 to 40 wt. %, (iii) a liquid or thermoplastic medium consisting of one or more polymers and/or solvents in a total quantity of 10 to 35 wt. %, (iv) sintering aids in pulverulent form in a quantity of 0 to 10 wt. % and (v) 0 to 40 wt. % silver powder.

The aluminum paste can be applied in the form of thin layers to the substrate by means of screen printing or other method known in the practice of decorating. The term "screen-printable" includes direct printing onto the substrate and the transfer technique.

Surprisingly, the aluminum pastes to be used according to the invention can be heated onto glass as substrate without difficulty in an atmosphere of air, even in a rapid firing, with firmly adhering, conductive layers based on aluminum, having a specific resistance of less than 100 $\mu$ohm·cm, being obtained. Depending on the glass frit used in the paste, layers having a specific resistance of less than 70 $\mu$ohm·cm are also obtainable, and particularly preferred pastes result in a specific resistance in the range of 20 to 50 $\mu$ohm·cm.

Surprisingly, the heated conductive layers are also distinguished by having a high adhesive strength—the scratch resistance is above 20 N, as determined by means of an Erichsen pin, which is drawn across the strip conductor produced according to the invention on glass. This scratch resistance is substantially preserved even after storage for 5 days at 70° C. and 90% relative humidity. These positive properties can be achieved in the aluminum paste not only with lead-containing glass frits, but also with lead-free glass frits, with even better values surprisingly being obtainable by using zinc-containing glass frits.

Neither was it foreseeable—and this is a particular advantage—that, with the use of preferred aluminum pastes containing a zinc borosilicate glass frit, the specific resistance remains substantially constant within a range of about ±20° C. below or above the conventional firing temperature.

The aluminum pastes contain preferably at least 50 wt. %, in particular 50 to 75 wt. % Al powder. The Al powder used is preferably granular and in particular spherical. Commercially available Al powder in the form of flakes is less suitable owing to the large diameter of the flakes ($d_{90}$ equal to/greater than 30 μm). The $d_{50}$ value is suitably in the range of 1 to 10 μm and in particular from 1 to 8 μm. The $d_{10}$ value is to be greater than 0.2 μm, in particular greater than 0.5 μm and particularly preferably in the range of 0.5 to 2 μm, preferably below 15 μm. The specific surface of the Al powder is conventionally in the range of 0.5 to 5 m²/g, but in individual cases these limits need not be met or can be exceeded. As the specific surface of the Al powder increases, however, the Al powder is less easily made into a paste, and this may possibly necessitate a decrease in the Al content. Particularly preferred Al powders are spherical, have a $d_{50}$ value of around 5 μm (±2 μm), a $d_{90}$ value of below 15 μm and a $d_{10}$ value of above 1 μm and a specific surface in the range of 0.5 to 3 m²/g. A portion of the Al powder may also be replaced by silver powder, but substantially silver-free pastes are preferred.

The glass frits used in the Al paste, both in connection with the quantity introduced and in connection with the chemical composition, greatly influence the properties of the heated Al coating. An important feature of the glass frit is the initial softening temperature. This can be determined with the aid of a test piece in a heating microscope. The initial softening temperature of glass frits used according to the invention is preferably in the range of 400 to 700° C., in particular 400 to 650° C. and particularly preferably from 420 to 580° C.

The glass frits are used in the grain sizes conventionally employed for screen printing. Generally the $d_{50}$ value is in the range of 0.5 to 10 μm, preferably in the range of 1 to 5 μm. It is advisable that the $d_{90}$ value be less than 15 μm, in particular less than 10 μm and that the devalue be greater than 0.2 μm, preferably greater than 0.5 μm.

The quantity of glass frit introduced into the Al paste can be in the range of 5 to 40 wt. %, but a range of 5 to 30 wt. % is preferred and 9 to 25 wt. % is particularly preferred. The optimal quantity introduced as regards the properties attainable in a heated Al coating in turn depends largely on the composition of the glass frit. Zinc borosilicate frits, even at a particularly low frit content of 10 to 15 wt. %, produce an extremely low specific resistance accompanied by excellent adhesion.

Lead borosilicate frits and lead-free glass frits can be used. Among the lead-free glass frits, zinc-containing, bismuth-containing or zinc- and bismuth-containing glass frits are suitable, as well as glass frits based on $SiO_2$, $B_2O_3$, $TiO_2$ or $Al_2O_3$ and $K_2O$. Glass frits which are primarily borosilicate frits and which also soften in the required temperature range are known to the experts. Representative frit compositions are based on the following obligatory components:

EP 0 790 220 B (in mol. %): $SiO_2$ 30–55, $B_2O_3$ 10–25, $TiO_2$ 15–30, $K_2O$ 10–17;

EP 0 728 710 B (in mol. %): $SiO_2$ 40–50, $B_2O_3$ 8–14, ZnO 13–19, $TiO_2$ 4–7, $Na_2O$ 10–15, $K_2O$ 0.1–2, F 1–5, $Al_2O_3$ 0.1–3;

EP 0 267 154 B (in mol. %): $SiO_2$ 45–60, $B_2O_3$ 6–13, ZnO 8–25, $Na_2O$ 5–14;

EP 0 558 942 (in mol. %): $SiO_2$ 10–44, $B_2O_3$ 11–35, ZnO 31–50, $Na_2O$ 11–25;

EP 0 854 120 A (in wt. %): $SiO_2$ 10–25, $B_2O_3$ 2–20, ZnO 3–15, $Bi_2O_3$ 20–55, $Na_2O$ 1–10;

EP 0 803 480 A (in wt. %): $SiO_2$ 10–25, $B_2O_3$ 20–40, ZnO 10–50, $Bi_2O_3$ 0–15, $Na_2O$ 7–10; and U.S. Pat. No. 5,714,420 (in wt. %): $SiO_2$ 20–35, $B_2O_3$ 5–15, ZnO 5–45, $Bi_2O_3$ 10–50, $Na_2O$.

Particularly suitable zinc borosilicate frits (see Example 3) for the production of strip conductors on glass with extremely low specific resistance and very good adhesion have the following compositions (in wt. %): $SiO_2$ 10–25, $B_2O_3$ 20–40, ZnO 10–50, $Bi_2O_3$ 0–15, $Na_2O$ 7–15, $Al_2O_3$ 3–8, F 0–2 and optical oxides such as CaO, $TiO_2$ and $ZrO_2$.

In another embodiment, the Al pastes may contain in addition pulverulent sintering aids in a quantity of up to 10 wt. %, preferably up to 6 wt. %. By sintering aids are meant all substances which lead to a higher degree of sintering at a given sintering temperature. Examples of sintering aids are metals, such as Zn, Mg, B, Si, in particular zinc and magnesium, fluorides, such as cryolite ($AlF_3$.3 NaF), NaF, $MgF_2$ and carbon. The action of the sintering aid may lie in the lowering of the melting point and/or in its reducing action during the firing process.

The organic medium serves to disperse the Al powder, the glass frit(s) and, if present, the sintering aid(s). The medium can be liquid or thermoplastic, and hence become liquid only at elevated temperature. Liquid organic media containing one or more polymers (=binders) and/or one or more solvents are preferred.

In principle, the medium may also be aqueous, but it is then advisable, in order to avoid a reaction between aluminum and water, that it contain in addition at least one compound from among the polybasic acids, such as maleic acid or its anhydride, succinic acid, polyacrylic acid, boric acid, sodium dihydrogen phosphate, sodium metasilicate or sodium triphosphate.

The medium particularly preferably contains both a binder and at least one organic solvent. The binder content is so chosen that a non-slip film is obtained after the Al paste has been dried. A quantity of binder in the range of 0.5 to 10 wt. % is particularly preferred, in particular 1 to 5 wt. %, based on the aluminum paste.

The selection of the binders is less crucial, provided that under the firing conditions they decompose and/or undergo combustion and in the course of this completely volatilise. Suitable binders are, for example, cellulose ether, acrylic esters and methacrylic esters, natural resins, colophony resins and modified alkyd resins.

The organic solvents used as components of the medium are those which volatilise during the firing free from bubbles and, if present, can dissolve the binder, and which lead to an aluminum paste having a suitable processing viscosity. Examples are terpene alcohols and terpene hydrocarbon; glycols and diglycols as well as ethers and esters of these;

cyclic and branched hydrocarbons, such as isoparaffins having a boiling point in the range of 160 to 220° C.; alcohols, ethers and esters having a boiling point in the range of 70 to 250° C., in particular 100 to 220° C. The quantity of solvent used is determined by the required viscosity and is in the range of 10 to 35 wt. %, preferably in the range of 10 to 30 wt. %. The Al paste particularly preferably contains 15 to 25 wt. % of a medium consisting of one polymer and one or more solvents. The Al paste to be used according to the invention can be prepared in the manner conventional for ceramic printing pastes, namely by intensive mixing of the components, for example, in a three-roll mill, disperser or in a ball mill.

The substrates are preferably sheets of glass, in particular those for motor vehicles. Other substrates are enamelled steel, "steel" meaning steel of any composition. The firing is carried out at a temperature in the range particularly preferably of 550 to 700° C., in particular 590 to 690° C. The Al paste is heated onto sheets of glass for automobiles under conditions approximately identical to those conventional for glass colorants, that is, in a rapid firing at 640 to 690° C. for a period of 1 to 10 minutes, in particular 4 to 6 minutes.

The aluminum paste according to the invention is applied by means of conventional processes of the type known for the production of decorations on glass or ceramic. These are conventional direct and indirect printing processes, in particular screen-printing processes. Application by spraying, dipping or by means of other techniques for applying decoration is also possible.

The invention also provides a coated substrate, which is characterized in that the substrate is glass, the coating contains 60 to 90 wt. % aluminum and the specific resistance of the conductive layer is in the range of 10 to 70 $\mu$ohm·cm.

As already explained above, it is also possible to produce coated substrates of a type which have a higher conductivity, corresponding to a lower specific resistance, and nevertheless excellent adhesion. Particularly preferred glass substrates coated with an aluminum coating are characterized by a specific resistance in the range of 20 to 50 $\mu$ohm·cm and a scratch resistance of at least 20 N.

The coating on glass according to the invention can serve as an alternative to conventional strip conductors for antennae and plate heating and thus replace the currently conventional silver strip conductors. The problem of discoloration known in Ag coatings and caused by Ag migration is thereby also avoided. A coating on enamelled steel according to the invention can also be used as radiant panel heating.

The following Examples illustrate the invention.

EXAMPLE 1

A homogeneous paste was prepared from:

(i) 54 wt. % aluminum powder with $d_{50}$=5 $\mu$m and a specific surface of 1.1 m²/g;

(ii) 14 wt. % lead borosilicate frit with $d_{50}$=2 $\mu$m and a hemisphere temperature of 470° C.;

(iii) 30 wt. % medium consisting of ethylcellulose, dissolved in terpineol and butyl diglycol acetate (content of binder in the medium 3 wt. %); and (iv) 2 wt. % zinc powder.

The paste was applied as a 25 $\mu$m thick film to a soda-lime glass by means of screen printing and, after having been dried, was fired in air at 720° C.

The specific resistance of the heated strip conductor was 70 $\mu$ohm·cm. The adhesion was good.

EXAMPLE 2

The paste from Example 1 was applied to enamelled steel. The specific resistance was 70 $\mu$ohm·cm and the adhesion was very good.

EXAMPLE 3

An aluminum paste was prepared in conventional manner from (i) aluminum powder ($d_{50}$=5 $\mu$m, $d_{90}$=13 $\mu$m and $d_{10}$=2 $\mu$m), (ii) a zinc borosilicate frit (in wt. %): $SiO_2$ 13%, ZnO 42%, $B_2O_3$ 25%, $Na_2O$ 13% and $Al_2O_3$ 6%; $d_{50}$=1.5 $\mu$m, $d_{90}$=6.1 $\mu$m and $d_{10}$=0.5 $\mu$m; initial softening temperature= 530° C. and (iii) a medium. The medium contained hydroxypropylcellulose in a quantity of 5 wt. % as binder and diethylene glycol mono-n-butyl ether as solvent. The paste invariably contained 25 wt. % medium. The frit content and Al content were varied, the sum amounting to 75 wt. %. A glass melt was printed by means of screen printing. The firing was carried out in the temperature range of 665 to 680° C. by rapid firing.

Table 1 shows the specific resistance in relation to the frit content in the firing temperatures. The lowest specific resistance is obtained at a frit content of 12 wt. % and an Al content of 63 wt. %. The change in the specific resistance in relation to the firing temperature was very small in the range of 665 to 680° C.

TABLE 1

| Glass frit | Spec. resistance ($\mu$ohm · cm) | | | |
|---|---|---|---|---|
| (wt. % in the paste) | 665° C. | 670° C. | 675° C. | 680° C. |
| 9 | 29 | 26 | 25 | 25 |
| 12 | 24 | 24 | 23.5 | 23.5 |
| 15 | 27 | 26 | 26 | 26.5 |
| 18 | 30 | 30 | 30 | 30 |
| 21 | 33 | 33 | 35 | 34 |
| 24 | 43 | 45 | 43 | 43 |

The adhesion, assessed as scratch resistance, was determined by means of an Erichsen needle. The latter was passed across a strip conductor. The adhesion was 5 N at 9% glass frit, equal to or greater than 20 N at 12% glass frit and above 20 N at a higher cintent (owing to the method, only values up to 20 N were measurable). The adhesive strenght and the specific resistance remained largely constant even after storage for several weeks in a climatic chamber (90% relative humidity, 70° C.).

EXAMPLE 4

As in Example 3, pastes were produced, each containing 25 wt. % medium, with a bismouth borosilicate frit containing 54 wt. % $Bi_2O_3$ being used instead of the glass frit employed in Example 3. The $d_{50}$ value was 1.5 $\mu$m; Initial softening temperature=550° C.

Table 2 shows the specific resistance and the adhesion in relation to the frit content. Heating was carried out for 4 minutes at 680° C.

TABLE 2

| Frit content (%) | Spec. resistance ($\mu$ohm · cm) | Adhesion (N) |
|---|---|---|
| 4.6 | 72 | 1 |
| 9.2 | 52 | 2 |
| 18.5 | 52 | 10 |
| 21.5 | 45 | =20 |
| 24.6 | 55 | >20 |
| 27.7 | 78 | >20 |

EXAMPLE 5

As in Example 3, a paste was prepared, printed onto glass and heated at 680° C. The sole difference from Example 3 was the use of a Pb-, Bi- and Zn-free borosilicate frit (product no. 501006 from Cerdec AG; $d_{50}$ value=2.2 µm, initial softening temperature=580° C.). It was made into a paste in the conventional manner, printed onto glass and heated at 680° C. Table 3 shows the specific resistance and the adhesion in relation to the frit content in the paste (frit+Al invariably 75 wt. %).

TABLE 3

| Frit (wt. %) | Spec. resistance (µohm · cm) | Adhesion (N) |
|---|---|---|
| 4.6 | 50 | 5 |
| 9.2 | 55 | 5 |
| 15.4 | 45 | =20 |
| 18.5 | 65 | >20 |
| 27.7 | 160 | >20 |

Al coatings having good adhesion (=20 N) and low specific resistance (45 µohm·cm) can also be obtained with the use of this frit at about 15 wt. % frit and 60 wt. % aluminum.

Whereas particular embodiments of this invention have been described above for purposes of illustration, it will be evident to those skilled in the art that numerous variations of the details of the present invention may be made without departing from the invention as defined in the appended claims.

What is claimed is:

1. A process for producing a conductive coating on a glass or enameled steel substrate, the method comprising:
   (a) applying to the substrate a layer of a paste, wherein the paste comprises:
   (i) a granular metal powder consisting essentially of aluminum powder having a $d_{50}$ value in the range of 1 to 10 µm in a quantity of 40 to 80 wt. % and from 0 to 40 wt. % silver powder;
   (ii) one or more glass frits having an initial softening temperature in the range of 400 to 700° C. and a $d_{50}$ value in the range of 1 to 10 µm in a quantity of 5 to 40 wt. %;
   (iii) a liquid or thermoplastic medium comprising one or more copolymers and/or solvents in a total quantity of 10 to 35 wt. %; and
   (iv) a sintering aid in pulverulent form in a quantity of 0 to 10 wt. %; and
   (b) heating the layer at a temperature in a range of from about 500 to about 750° C.

2. The process according to claim 1, wherein the substrate comprises automobile glass and the paste is substantially silver-free and comprises:
   (i) 50 to 75 wt. % of a granular, substantially spherical metal powder consisting essentially of aluminum powder having a $d_{50}$ value in the range of 1 to 8 µm;
   (ii) 5 to 30 wt. % of one or more glass frits selected from the group consisting of zinc-containing borosilicate frits, bismuth-containing borosilicate frits, glass frits based on $K_2O$, $TiO_2$, $B_2O_3$ and $SiO_2$ and mixtures thereof, having a $d_{50}$ value in the range of 1 to 5 µm;
   (iii) 15 to 25 wt. % organic medium; and
   (iv) 0 to 6 wt. % of one or more pulverulent sintering aids selected from zinc, magnesium, boron, silicon and carbon.

3. The process according to claim 1, wherein the paste contains substantially spherical aluminum powder having a $d_{50}$ value in the range of 1 to 8 µm, a $d_{90}$ value of less than 15 µm, and a $d_{10}$ value of greater than 0.5 µm.

4. The process according to claim 1, wherein the aluminum paste contains one or more glass frits having a $d_{50}$ value in the range of 1 to 5 µm, a $d_{90}$ value of less than 10 µm and a $d_{10}$ value of greater than 0.2 µm.

5. The process according to claim 1, wherein the aluminum paste contains one or more glass frits having an initial softening temperature in the range of 420 to 580 C. in a quantity of 9 to 25 wt. %, where the glass frits have the following compositions in wt. %: $SiO_2$ 10–25; $B_2O_3$ 20–40; ZnO 10–50; $Bi_2O_3$ 0–15; $Na_2O$ 7–15; $Al_2O_3$ 3–8; F 0–2 and optional oxides, selected from at least one of: CaO, $TiO_2$ and $ZrO_2$.

6. The process according to claim 1, wherein the aluminum paste is applied to the substrate by means of direct or indirect screen printing.

7. The process according to claim 1, wherein the substrate comprises automobile glass, and the coating is heated by a firing at a temperature in the range of 550 to 700° C.

* * * * *